(12) United States Patent
Westby

(10) Patent No.: US 10,665,741 B2
(45) Date of Patent: May 26, 2020

(54) WINDOW INSULATING AND POWER GENERATION SYSTEM

(71) Applicant: Total Shade Inc., Barrington, IL (US)

(72) Inventor: David A. Westby, Barrington, IL (US)

(73) Assignee: TOTAL SHADE INC., Barrington, IL (US)

( * ) Notice: Subject to any disclaimer, the term of this patent is extended or adjusted under 35 U.S.C. 154(b) by 53 days.

(21) Appl. No.: 15/173,878

(22) Filed: Jun. 6, 2016

(65) Prior Publication Data
US 2016/0359069 A1 Dec. 8, 2016

Related U.S. Application Data

(60) Provisional application No. 62/170,795, filed on Jun. 4, 2015.

(51) Int. Cl.
*H01L 31/0468* (2014.01)
*H01L 31/053* (2014.01)
(Continued)

(52) U.S. Cl.
CPC ...... *H01L 31/0468* (2014.12); *H01L 31/0488* (2013.01); *H01L 31/0543* (2014.12);
(Continued)

(58) Field of Classification Search
CPC .......... H02S 20/00; H02S 20/20; H02S 20/22; H02S 20/30; H02S 30/00; H02S 30/10;
(Continued)

(56) References Cited

U.S. PATENT DOCUMENTS 2,336,692 A 4/1943 Lubetsky
3,973,553 A 8/1976 Lanciault
(Continued)

FOREIGN PATENT DOCUMENTS

CN 1873157 12/2006
DE 10121660 11/2002
(Continued)

OTHER PUBLICATIONS

Notification Concerning Transmittal of International Preliminary Report on Patentability dated Dec. 14, 2007 with International Preliminary Report on Patentability corresponding to International Application No. PCT/US2016/035998.
(Continued)

*Primary Examiner* — Susan D Leong
(74) *Attorney, Agent, or Firm* — McAndrews, Held & Malloy, Ltd.

(57) ABSTRACT

A window assembly. The window assembly is exposed to radiant light, and comprises a window pane, a solar module positioned adjacent the window pane. The solar module includes a) a photovoltaic layer to receive at least a portion of the radiant light, and to convert the radiant light into electrical energy, and b) an insulating substrate having a predefined openness and being positioned proximate the photovoltaic layer, to block out another portion of the radiant light based on the openness. The window assembly also comprises an energy device being in electrical communication with the photovoltaic layer to receive and distribute the electrical energy.

21 Claims, 7 Drawing Sheets

(51) Int. Cl.
*H02S 20/30* (2014.01)
*H01L 31/048* (2014.01)
*H02S 40/32* (2014.01)
*H01L 31/054* (2014.01)

(52) U.S. Cl.
CPC .............. *H02S 20/30* (2014.12); *H02S 40/32* (2014.12); *Y02B 10/10* (2013.01); *Y02E 10/52* (2013.01)

(58) Field of Classification Search
CPC ..... H02S 40/32; H01L 31/02; H01L 31/0392; H01L 31/048; H01L 31/0488; H01L 31/0468
See application file for complete search history.

(56) References Cited

U.S. PATENT DOCUMENTS

| | | |
|---|---|---|
| 4,151,871 A | 5/1979 | Ryan |
| 4,247,599 A | 1/1981 | Hopper |
| 4,290,473 A | 9/1981 | Pierson et al. |
| 4,530,739 A | 7/1985 | Hanak et al. |
| 4,636,579 A | 1/1987 | Hanak et al. |
| 4,765,726 A | 8/1988 | Johnson |
| 4,890,900 A | 1/1990 | Walsh |
| 5,086,828 A | 2/1992 | Ewert |
| 5,128,181 A | 7/1992 | Kunert |
| 5,204,777 A | 4/1993 | Curshod |
| 5,221,363 A | 6/1993 | Gillard |
| 5,258,076 A | 11/1993 | Wecker |
| 5,379,753 A | 1/1995 | Noennich |
| 5,433,259 A | 7/1995 | Faludy |
| 6,018,123 A | 1/2000 | Takada et al. |
| 6,182,403 B1 | 2/2001 | Mimura et al. |
| 6,297,900 B1 | 10/2001 | Tulloch et al. |
| 6,459,033 B1 | 10/2002 | Muller |
| 6,646,196 B2 | 11/2003 | Fronek et al. |
| 6,688,053 B2 | 2/2004 | Winarski |
| 7,576,282 B2 | 8/2009 | Heidenreich |
| 7,845,127 B2 | 12/2010 | Brescia |
| 8,058,549 B2 | 11/2011 | Kothari et al. |
| 8,599,081 B2 | 12/2013 | Leung et al. |
| 8,618,410 B2 | 12/2013 | Hollars |
| 8,698,681 B2 | 4/2014 | Leung et al. |
| 8,728,857 B1 | 5/2014 | Nielson et al. |
| 8,748,729 B2 | 6/2014 | Nocito et al. |
| 8,921,685 B2 | 12/2014 | Razin et al. |
| 9,126,392 B1 | 9/2015 | Nielson et al. |
| 9,190,546 B1 | 11/2015 | Anderson et al. |
| 9,287,430 B1 | 3/2016 | Nielson et al. |
| 2003/0098056 A1 | 5/2003 | Fronek et al. |
| 2004/0055633 A1 | 3/2004 | Lambey |
| 2004/0246596 A1 | 12/2004 | Dyson et al. |
| 2005/0102934 A1 | 5/2005 | Winarski |
| 2005/0215147 A1* | 9/2005 | Masters .................. D04B 21/16 442/59 |
| 2006/0181094 A1 | 8/2006 | Mitsunari |
| 2007/0056579 A1 | 3/2007 | Straka |
| 2007/0074754 A1 | 4/2007 | Farquhar et al. |
| 2007/0283996 A1* | 12/2007 | Hachtmann ............. H02S 20/23 136/244 |
| 2008/0155910 A1 | 7/2008 | Reuter |
| 2008/0163984 A1 | 7/2008 | Lambey |
| 2009/0139562 A1 | 6/2009 | Thomas |
| 2009/0173375 A1 | 7/2009 | Frazier et al. |
| 2009/0255568 A1 | 10/2009 | Morgan |
| 2009/0320388 A1 | 12/2009 | Lilli et al. |
| 2010/0051084 A1 | 3/2010 | Nocito et al. |
| 2010/0051100 A1 | 3/2010 | Nocito et al. |
| 2010/0307554 A1 | 12/2010 | Migliozzi |
| 2011/0240096 A1 | 10/2011 | Maheshwari |
| 2011/0265854 A1 | 11/2011 | Young |
| 2011/0265956 A1 | 11/2011 | Cavarec et al. |
| 2012/0061029 A1 | 3/2012 | Weston |
| 2012/0073623 A1* | 3/2012 | Jones ................ H01L 31/02013 136/245 |
| 2012/0167943 A1 | 7/2012 | Blanchard et al. |
| 2012/0317900 A1 | 12/2012 | Den Boer et al. |
| 2013/0037080 A1 | 2/2013 | Helfan et al. |
| 2013/0061542 A1 | 3/2013 | Weidner |
| 2013/0061902 A1 | 3/2013 | Quinn |
| 2013/0100675 A1 | 4/2013 | Han et al. |
| 2013/0153006 A1 | 6/2013 | Cox et al. |
| 2014/0027069 A1 | 1/2014 | Oppizzi |
| 2014/0116497 A1 | 5/2014 | Sanders |
| 2015/0129140 A1 | 5/2015 | Dean et al. |
| 2015/0204561 A1* | 7/2015 | Sadwick ................ F24F 11/006 236/1 C |
| 2016/0359069 A1 | 12/2016 | Westby |

FOREIGN PATENT DOCUMENTS

| | | |
|---|---|---|
| DE | 102011116794 | 4/2013 |
| DE | 102012111884 | 3/2014 |
| DE | 102013221154 | 4/2015 |
| EP | 0511956 | 11/1992 |
| EP | 0593201 | 4/1994 |
| FR | 2862428 | 5/2005 |
| FR | 2869461 | 10/2005 |
| FR | 2948818 | 2/2011 |
| GB | 2457255 | 8/2009 |
| IT | PD20100313 | 4/2012 |
| JP | S61202479 | 9/1986 |
| JP | WO2012091068 | 6/2014 |
| WO | 20080137966 | 11/2008 |
| WO | 2009121180 | 10/2009 |
| WO | 2011112842 | 9/2011 |
| WO | 2012167759 | 12/2012 |
| WO | 2014088777 | 6/2014 |
| WO | 2014152783 | 9/2014 |
| WO | 2016197094 | 12/2016 |

OTHER PUBLICATIONS

PCT Notification of Transmittal of the International Search Report and the Written Opinion of the International Searching Authority, or the Declaration, International Application No. PCT/US 16/35998, dated Jun. 6, 2016, 14 pages.

Communication pursuant to Rules 161(2) and 162 EPC corresponding to European Patent Application No. EP 16804632.4, dated dated Jan. 11, 2018, 3 pages.

Extended European Search Report for European Patent Application No. 16804632.4 dated Dec. 3, 2018, 7 pages.

Karlsson, J., "Control System and Energy Saving Potential for Switchable Windows," Seventh International IBPSA Conference, Building Simulation, Rio de Janeiro, Brazil, Aug. 13-15, 2001, pp. 199-206.

* cited by examiner

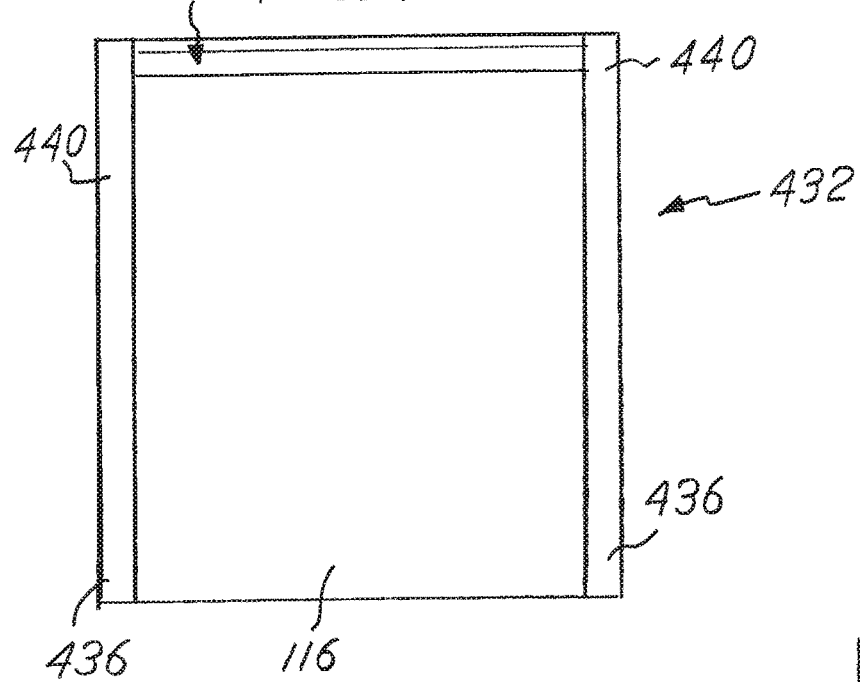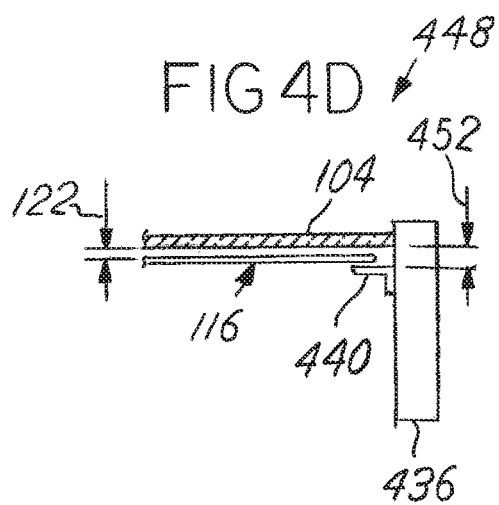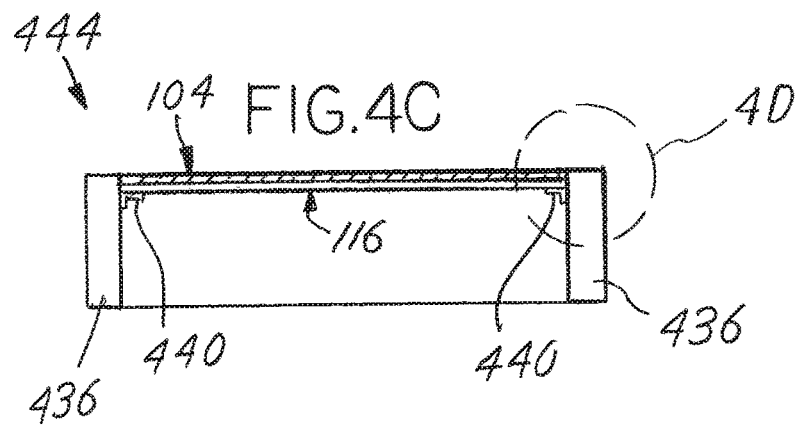

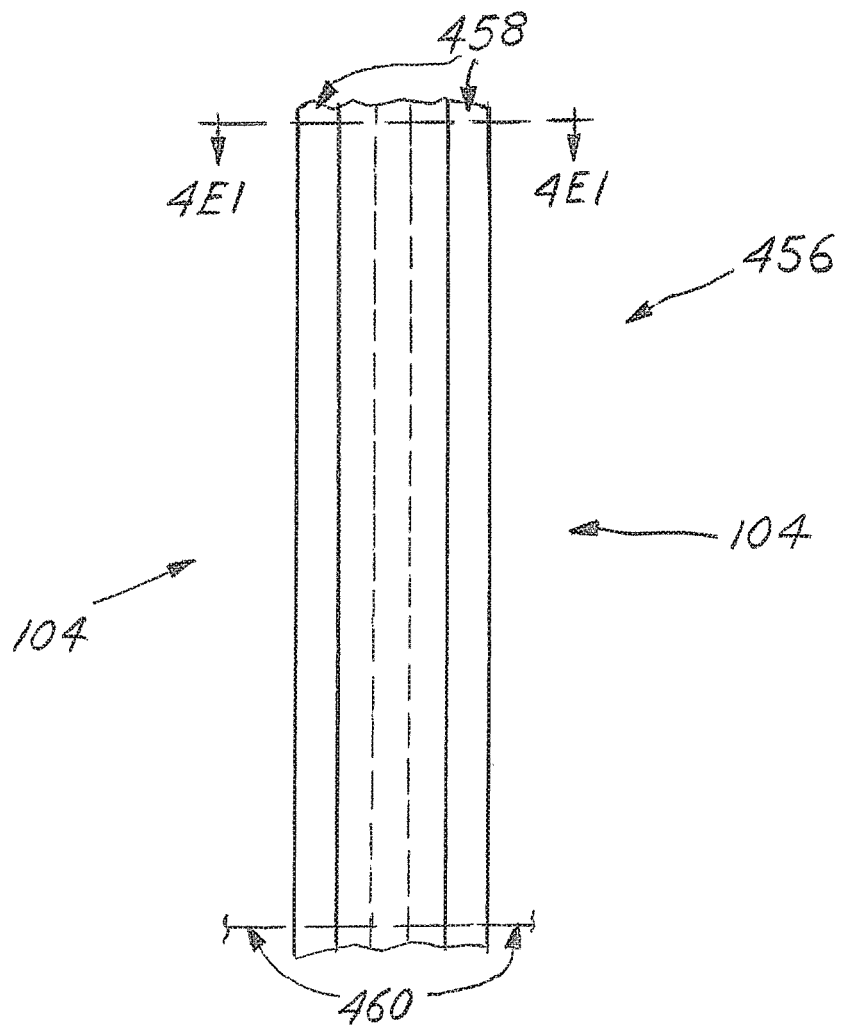
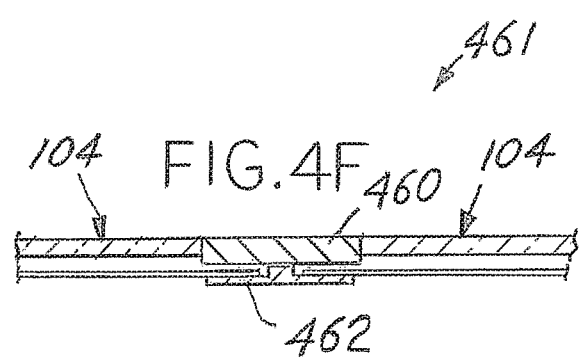

WINDOW INSULATING AND POWER GENERATION SYSTEM

RELATED APPLICATIONS

This application is a continuation of U.S. Provisional Patent Application No. 62/170,795, filed Jun. 4, 2015, entitled "Window Insulating and Power Generation System." The above-identified application is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

BACKGROUND

The invention relates to energy collection, and more particularly, to renewable energy collection using a window assembly.

Light is an important source of renewal energy. Different methods and systems have been used to prevent radiant light from entering spaces through windows and openings. However, preventing or being unable to harness renewal energy from radiant light from entering spaces through windows and openings also translates into loss of readily available renewal energy.

BRIEF SUMMARY

The present invention relates to power systems, and more particularly to methods for harnessing power from light.

In one embodiment, the invention provides a window assembly. The window assembly includes a window pane having a surface being exposed to radiant light. The window assembly also includes a solar module positioned adjacent the surface of the window pane. The solar module further includes a photovoltaic layer to receive at least a portion of the radiant light, and to convert the received radiant light into electrical energy. The solar module further includes an insulating substrate having a predefined openness that is disposed proximate to the photovoltaic layer to channel at least another portion of the radiant light based on the openness. The window assembly also includes an energy module that is in electrical communication with the solar module to receive and then distribute the electrical energy.

In another embodiment, the invention provides a window assembly that is exposed to radiant light, and comprises a window pane, a solar module positioned adjacent the window pane. The solar module includes a) a photovoltaic layer to receive at least a portion of the radiant light, and to convert the received radiant light into electrical energy, and b) an insulating substrate having a predefined openness, and being disposed proximate to the photovoltaic layer, to channel radiant light based on the openness. The window assembly also comprises an energy module being in electrical communication with the photovoltaic layer to receive and distribute the electrical energy.

In yet another embodiment, the invention provides a method of harnessing electrical energy via an assembly being exposed to radiant light. The assembly includes a photovoltaic layer being exposed to the radiant light, an insulating substrate having a predefined openness and is disposed proximate to the photovoltaic layer, and an energy module in electrical communication with the photovoltaic layer. The method includes converting at the photovoltaic layer a portion of the radiant light into electrical energy, and channeling radiant light from the insulating substrate based on the openness. The method also includes receiving the converted electrical energy at the energy module.

Various advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 4B illustrates a front view of the window assembly of FIG. 1.

FIG. 4C illustrates a top view of the window frame with respect to the side moldings of FIG. 4B.

FIG. 4D illustrates an expanded view of the window frame with respect to the side moldings of FIG. 4C.

FIG. 4E illustrates an alternative embodiment in the form of a dual side molding of the solar module.

FIG. 4F illustrates a top sectional view of FIG. 4E along the line 4E1-4E1.

Figure 1:
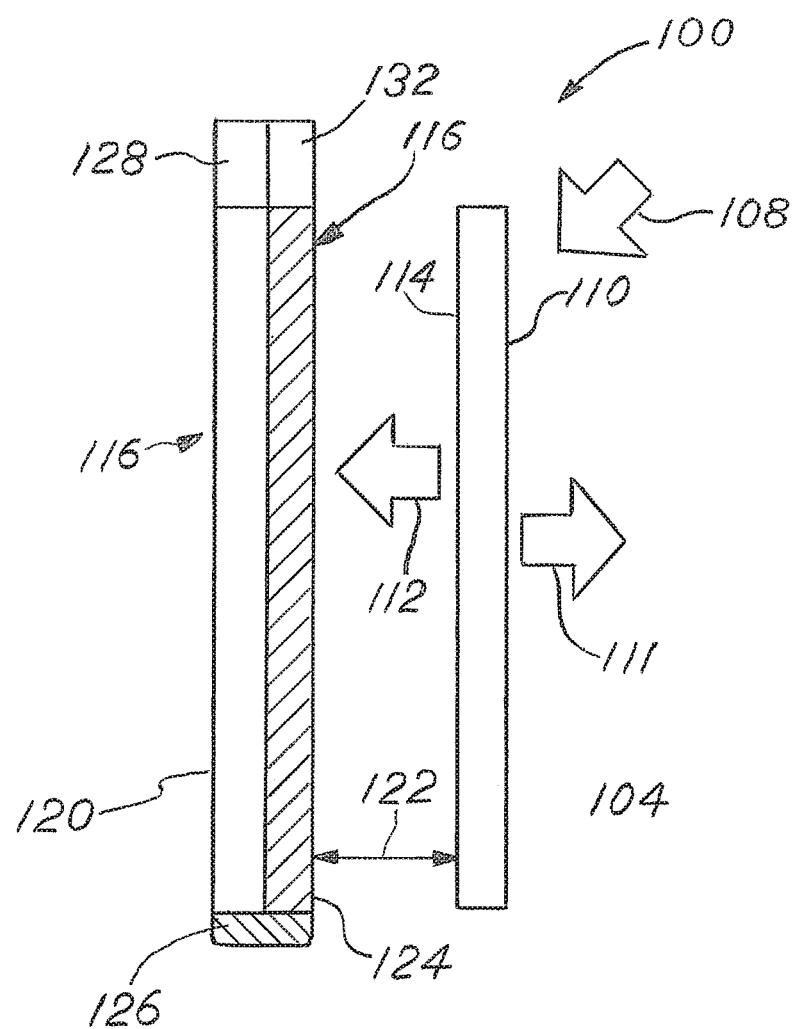
FIG. 1 illustrates a window assembly according to one embodiment of the invention.

The foregoing summary, as well as the following detailed description of certain embodiments of the present invention, will be better understood when read in conjunction with the appended drawings. For the purpose of illustrating the invention, certain embodiments are shown in the drawings. It should be understood, however, that the present invention is not limited to the arrangements and instrumentality shown in the attached drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein are for the purpose of description and should not be regarded as limiting.

As should also be apparent to one of ordinary skill in the art, the systems shown in the figures are models of what actual systems might be like. Some of the modules and logical structures described are capable of being implemented in software executed by a microprocessor or a similar device or of being implemented in hardware using a variety of components including, for example, application specific integrated circuits ("ASICs"). Terms like "processor" may include or refer to both hardware and/or software. Furthermore, throughout the specification capitalized terms are used. Such terms are used to conform to common practices and to help correlate the description with the drawings. However, no specific meaning is implied or should be inferred simply due to the use of capitalization.

As utilized herein the terms "circuits" and "circuitry" refer to physical electronic components (i.e. hardware) and any software and/or firmware ("code") which may configure the hardware, be executed by the hardware, and/or otherwise be associated with the hardware. As used herein, for example, a particular processor and memory may comprise a first "circuit" when executing a first plurality of lines of code and may comprise a second "circuit" when executing a second plurality of lines of code. As utilized herein, "and/or" means any one or more of the items in the list joined by "and/or". As an example, "x and/or y" means any element of the three-element set $\{(x), (y), (x, y)\}$. As another example, "x, y, and/or z" means any element of the seven-element set $\{(x), (y), (z), (x, y), (x, z), (y, z), (x, y, z)\}$. As utilized herein, the terms "block" and "module" refer to functions than can be implemented in hardware, software, firmware, or any combination of one or more thereof. As utilized herein, the term "exemplary" means serving as a non-limiting example, instance, or illustration. As utilized herein, the term "e.g.," introduces a list of one or more non-limiting examples, instances, or illustrations.

Embodiments of the invention relate to an insulating power generation assembly. The insulating power generation assembly is exposed to radiant light, and comprises an optional window pane, a solar module positioned adjacent the window pane, and including a) a photovoltaic layer to convert at least a portion of the radiant light into electrical energy, and b) an insulating substrate being proximate the photovoltaic layer and having a predefined openness to block out another portion of the radiant light based on the openness. The window assembly also comprises an energy module being in electrical communication with the photovoltaic layer to receive and distribute the electrical energy.

FIG. 1 illustrates a window assembly 100 according to one embodiment of the invention. Window assembly 100 may be a part of an opening of a residential or commercial space, an electronic device, a mobile machine such as, for example, planes, trains, or automobiles, or the like. Exemplary window types may include, but are not limited to, eyebrow window, fixed windows, single-hung sash windows, double-hung sash windows, horizontal sliding sash windows, casement windows, awning windows, hopper windows, tilt windows, slide windows, tilt and slide windows, turn windows, tilt and turn windows, transom windows, sidelight windows, Jalousie windows, louvered windows, clerestory windows, skylights windows, roof windows, roof lanterns, bay windows, oriel windows, thermal windows, Diocletian windows, picture windows, emergency exit windows, stained glass windows, French windows, glass doors, double-paned windows, triple-paned windows, glass doors, transparent walls, windshields, building panels, roof panels, and the like. Building panels my positioned on high rise buildings and could cover up to a third of a building's surface.

Window assembly 100 may include a window pane of glass or plastic 104. An exemplary window pane may be a double pane window. Window pane may include, but is not limited to, cast glass, crown glass, cylinder glass, drawn sheet glass, cast plate glass, polished plate glass, rolled plate glass, float glass, prism glass, glass block, annealed glass, laminated glass, tempered glass, heat-strengthened glass, chemically strengthened glass, low-emissivity glass, heatable glass, self-cleaning glass, insulated glazing, evacuated glazing, and the like. In the embodiment shown in FIG. 1, window assembly 100 may be placed into a position where window assembly 100 is exposed to radiant light, artificial or natural, or some predetermined frequencies of the radiant light, as represented by arrow 108 on an exterior surface 110 of window pane 104. Exterior surface may be a planar surface. When window pane 104 is exposed to the radiant light as illustrated by arrow 108, a portion of radiant light 108 may be transmitted or refracted by window pane 104 resulting in a transmitted or refracted portion of the radiant light as illustrated by arrow 112 radiating from an interior surface 114 of window pane 104, based on a refraction index of window pane 104. Another portion of radiant light 108 may be reflected by window pane 104, as illustrated by arrow 111, based on a reflectivity index of window pane 104. Depending on the type of materials and colors used in window pane 104, the amount of transmitted or refracted portion of radiant light 112 may be substantially more than the amount of reflected portion of the radiant light, as illustrated by arrow 111.

Although the embodiment of window assembly 100 as shown in FIG. 1 includes window pane 104, window assembly 100 may not include any window pane in other embodiments. In embodiments where window assembly 100 does not include a window pane, window assembly 100 may be positioned at or over an opening of the residential or commercial space, or covering an exterior or interior portion of the residential or commercial space, an electronic device, a mobile machine, or the like. Alternatively, window assembly 100 may also be a partial or complete exterior panel, such as, for example, a semi-transparent exterior wall of the residential or commercial space, electronic device, mobile machine, or the like. Still alternatively, window assembly 100 may also be a partial or complete exterior covering for the residential or commercial space, electronic device, mobile machine, or the like.

In the embodiment shown in FIG. 1, window assembly 100 includes a solar module 116. Solar module 116 may be in the form of blinds, vertical blinds, roller blinds, drapes, screens, shades, curtains, canopy, sunshade, slats, and the like. In some embodiments, solar module 116 may be structurally flexible, allowing solar module 116 to be fitted over an object based on applications. In the embodiment shown, solar module 116 includes a substrate 120 which may include a flexible fabric in the form of a mesh scrim. Exemplary types of substrates may include, but are not limited to, Polyethylene terephthalate (PET), Gorilla glass or Willow glass, Polychlorotrifluoroethene (PCTFE) or (Kel-F), polycarbonate, Polyethylene terephthalate glycol-modified (PETG), Polyvinyl chloride (PVC), perforated films, flexible adhesives, Duroflex, and the like. Depending on the type of substrate used, substrate 120 may have different degrees of flexibility.

Substrate 120 may also have different degrees of openness that determine amounts of light being able to transmit or pass through substrate 120. For example, a 5% openness results in 5% of the refracted radiant light as illustrated by arrow 112 being able to transmit or pass through substrate 120. Similarly, an 85% openness results in 85% of the refracted radiant light as illustrated by arrow 112 transmitting or passing through substrate 120. Exemplary openness may range, but is not limited to, from 1% to 15%. In some embodiments, substrate 120 may have a varying openness (not shown). For example, substrate 120 may have 15% openness near the top of substrate 120, and 1% openness near the bottom of substrate 120. In some embodiments, the openness of substrate 120 may also define how much light passes through solar module 116, which may in turn define how much can be seen through solar module 116. For example, a solar module 116 having a substrate 120 of 85% openness allows more light to pass through, and thus allows more to be seen through solar module 116, than a solar module 116 having a substrate 120 of 15% openness.

An exemplary mesh scrim may include TEXTILENE™ scrim from Twitchell Corp. of Dothan, Ala., which is coated before weaving, preferably with a white coating. Other exemplary mesh scrim may include PVC coated mesh scrim (PCS 1018) from Snyder Manufacturing, Inc., which is coated after weaving, preferably with a white coating. Exemplary mesh scrims include 18×14, 840/1000 denier woven fabric using 0.025 inch diameter vinyl-coated 1000 denier polyester core yarn. In such cases, the mesh scrim may have rectangular holes with widths ranging from 0.015 inches to 0.025 inches. These mesh scrim may also have thickness ranging from 0.030 inches to 0.050 inches, and having an average thickness of 0.040 inches. Other exemplary substrate may include carbon fiber substrates, and non-movable stationary panel substrates. Other screen manufacturer includes Phifer Inc of Tuscaloosa, Ala.

In the embodiment shown, solar module 116 is positioned adjacent window pane 104 at a distance 122 ranging from 0 inches to 1/16 inches. In some embodiments, distance 122 may affect an effectiveness of solar module 116. For example, in some embodiments, if distance 122 is greater than 1/16 inches, the effectiveness of solar module 116 may drop linearly based on distance 122. In other embodiments, however, distance 122 may range from 4 inches to 6 inches with a drop of about 6% of productivity by solar module 116. Further, some parameters of window pane 104 may also determine or affect distance 122 with respect to the effectiveness. Exemplary window pane parameters may include a color of window pane 104, a thickness of window pane 104, an energy index of window pane 104, and the like. In other embodiments, at least a portion of solar module 116 is positioned directly on window pane 104, resulting in distance 122 being zero, to increase or maximize its exposure to radiant light 108. In such embodiments, solar module 116 may be adhered directly to window pane 104.

In some embodiments, substrate 120 may include multiple layers of different substrates (not shown). For example, in one such embodiment, substrate 120 includes a sheet of white plastic mesh scrim having a thickness ranging from 0.030 inches to 0.050 inches, preferably less than 0.05 inches. The white plastic mesh scrim may be laminated to a clear PVC sheet having a thickness ranging from 0.005 inches to 0.010 inches, forming laminated substrate 120. Laminated substrate 120 may be held to window pane 104 with surface adhesion, adsorbtion, static cling, or the like. In some embodiments, substrate 120 may include UV-resistant optical plastic, such as, for example, Zeonex, PMMA, and the like. In some embodiments, substrate 120 may also be weather-proofed for outdoor usages on the buildings and/or mobile machines, such as, for example, vehicles.

Solar module 116 includes a photovoltaic (PV) layer or film 124 disposed proximate to substrate 120. In the embodiment shown, PV film 124 faces interior surface 114 of window pane 104, thus receiving the transmitted or refracted radiant light, as illustrated by arrow 112. In some embodiments, PV film 124 may be adhered to substrate 120, via an adhesive layer located between flexible PV film 124 and substrate 120. In other embodiments, a sheet of laminable material, such as, for example, a transparent, or semi-transparent or opaque perforated polymer such as EVA, PET, Polyester, LDPE, HDPE, PP may be incorporated or sandwiched between flexible PV film 124 and substrate 120, forming a solar sandwich structure. In such embodiments, the solar sandwich structure may undergo a thermal and pressure cycle, or any other thermal processes, to join flexible PV film 124 and substrate 120, forming a laminated solar module 116. Other methods of attaching PV film 124 to substrate 120 include, but are not limited to, sewing and fastening together flexible PV film 124 and substrate 120. In some embodiments, flexible PV film 124 may include a plurality of PV sub-films arranged on substrate 120. In some embodiments, the plurality of PV sub-films may be discretely, non-evenly, or non-continuously arranged on substrate 120. In some embodiments, the plurality of PV sub-films may be specifically discretely, non-evenly, or non-continuously distributed on substrate 120. For example, in some embodiments, the plurality of PV sub-films may be less densely populated towards solar module 116. For another example, in some embodiments, the plurality of PV sub-films may be progressively more densely populated away from solar module 116. Exemplary processes of manufacturing PV films are described in U.S. Pat. Nos. 8,618,410, 8,618,409, and 8,586,398, to MiaSole.

A bar weight 126 is mounted to a lower portion or margin of solar module 116 to stabilize solar module 116, or to maintain the shape of solar module 116, and may also be used to maintain distance 122 of solar module 116 from window pane 104. In some embodiments, bar weight 126 may be optional depending on the weight of solar module 116.

PV film 124 may include a number of PV cells (detailed hereinafter) to receive the transmitted or refracted radiant light. Exemplary PV cells may include, but are not limited to, one or more of Monocrystalline cells, Polycrystalline (or Multicrystalline) cells, Amorphous cells, and the like. In some embodiments, when PV film 124, and PV cells, are exposed either to the radiant light or the transmitted or refracted radiant light as discussed above, the PV cells absorb the radiant light and generate electrons. The generated electrons are converted to electrical energy. Other conversions may also be used based on applications, and/or types of PV cells being used.

PV film 124 may also include a network of conductors, ribbons, and/or conduits connecting the PV cells and/or being woven into or sandwiched throughout substrate 120 and PV film 124. When PV cells are exposed to the transmitted or refracted radiant light, PV cells convert the radiant light energy into electrical energy as discussed above. PV cells may distribute the converted electrical energy via the network of conductors, ribbons, and/or conduits to a collector terminal (detailed hereinafter). In some embodiments, the converted electrical energy is a direct-current (DC) electrical energy.

Window assembly 100 also includes an energy module 128 that electrically communicates with PV film 124 via the network of conductors, ribbons, and/or conduits at the collector terminal. For example, energy module 128 may be coupled to PV cells via the network of conductors, ribbons, and/or conduits, and collect the converted electrical energy at the collector terminal. As discussed above, the converted electrical energy is a DC electrical energy. In such embodiments, energy module 128 also includes an inverter (not shown), detailed hereinafter, to convert the DC electrical energy into an alternate-current (AC) electrical energy. Alternatively, solar module 116 may also include an embedded inverter to convert the DC electrical energy into an AC electrical energy.

Window assembly 100 also includes a guiding module 132 coupled to energy module 128 to position or guide solar module 116. In some embodiments, guiding module 132 may control an amount of solar module 116 that is exposed to the radiant light. For example, by extending or contracting solar module 116, guiding module 132 may control an amount of exposure of solar module 116, thus also being able to control an amount of electrical energy being generated. It should be noted that, although guiding module 132, energy module 128, solar module 116, and weight bar 126 are shown to have similar cross-sectional widths, guiding module 132, energy module 128, solar module 116, and weight bar 126 are merely shown for illustration purposes, and thus may have different physical properties. For example, in some embodiments, a single enclosure may embed therein both guiding module 132 and energy module 128, discussed hereinafter.

Figure 2:
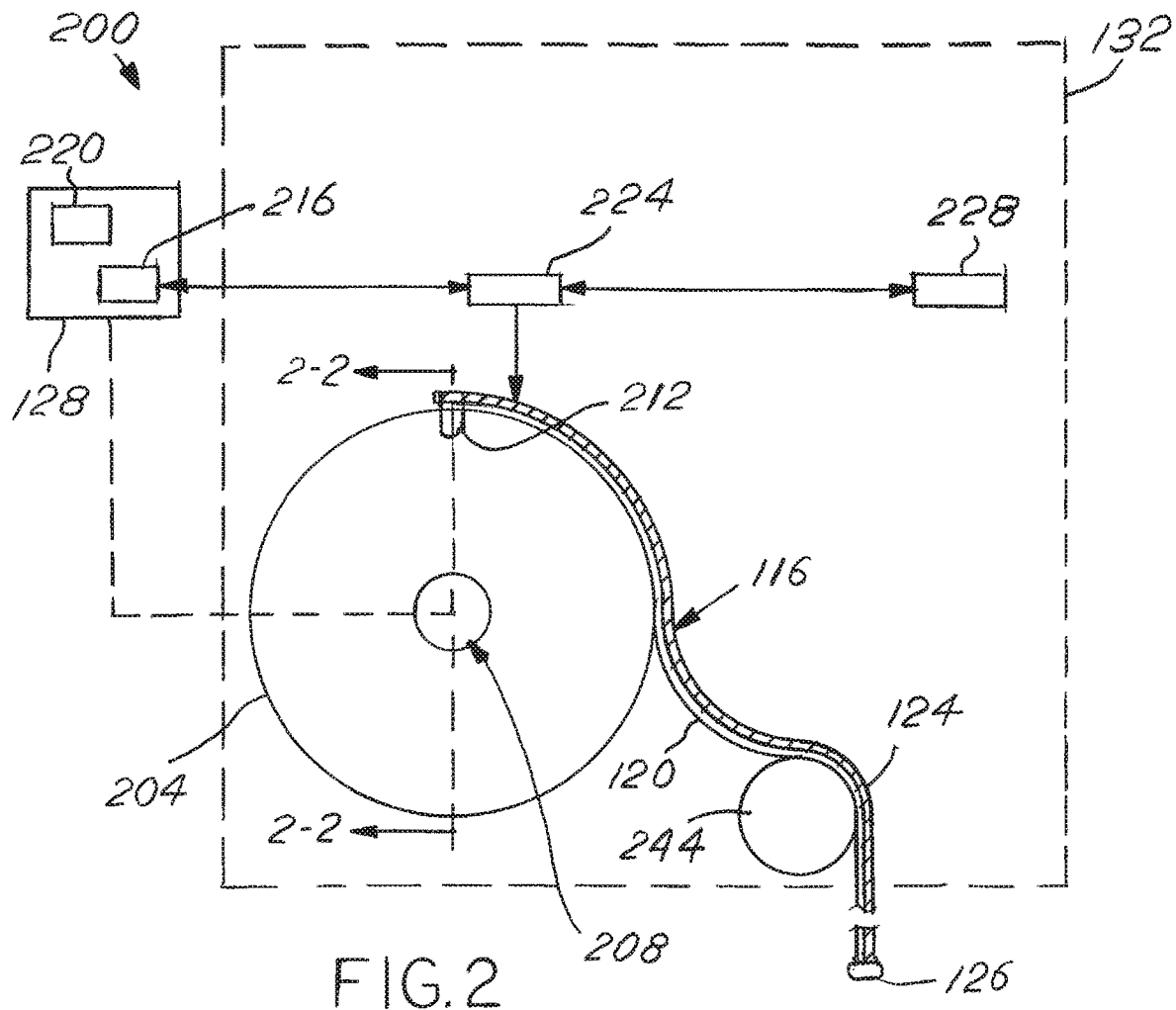
FIG. 2 is an exemplary schematic diagram illustrating details of the energy module and the guiding module as shown in FIG. 1 used in accordance with embodiments of the invention.

FIG. 2 is an exemplary schematic diagram 200 illustrating details of energy module 128 and guiding module 132 used in accordance with embodiments of the invention, wherein like reference numerals are used to refer to like parts. As discussed above, different types and/or multiple layers of substrates may also be used. In an embodiment shown in FIG. 2, solar module 116 is in the form of a roller blind, and guiding module 132 includes a roller device 204 for use with the roller blind.

In the embodiment shown in FIG. 2, roller device 204 includes a rotatable connector 208 that is connected to the network of conductors and the plurality of PV cells (as discussed above) on the PV film 124. The network of conductors, as discussed above, converges at a collector terminal or connector 212, which transfers the converted electrical energy to rotatable connector 208, which further transfers the converted electrical energy to the energy module 128. In the embodiment shown, the energy module 128 includes an optional battery or storage 216 for storage, and/or an inverter 220 for converting the converted electrical energy, for example, from DC electrical energy to alternate-current (AC) electrical energy.

In one embodiment, as discussed above, the converted electrical energy from the flexible solar module 116 may be collected via a variety of flexible conductors, flat cables, or ribbons that may be embedded or sandwiched between substrate 120 and PV film 124. For example, flexible wire (Flexwire) may be used. Ends or terminals of the flexible conductors, flat cables, or ribbons may be physically connected to roller device 204 at the connector 212. The roller device 204 may also be connected to solar module 116 with either flexible spring connectors or brushes at connector 212. Connector 212 may be connected via wiring and connectors to either inverter 220 or storage 216 to store energy. As discussed above, solar module 116 may have an inverter embedded therein. In such embodiments, energy module 128 may only include battery or storage 216 for storage.

Figure 2A:
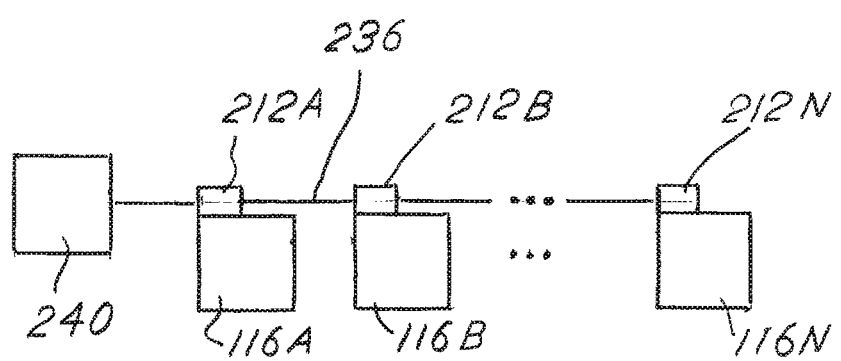
FIG. 2A is an exemplary schematic diagram illustrating details of a network of solar modules having a plurality of connectors used in accordance with embodiments of the invention.

Alternatively, as shown in FIG. 2A, connector 212 may be a first connector 212A of a network of N connectors 212A, 212B, . . . , 212N of a plurality of solar modules 116A, 116B, . . . , 116N, linked together in a network 236. In some embodiments, network 236 is a daisy-chained network. In such embodiments, connectors 212A, 212B . . . 212N may converge at an optional summing circuit 240 for summing the converging converted electrical energy. The converted electrical energy is then fed to energy module 128 for storage or the optional inversion.

In some embodiments, guiding module 132 may also include a stepper motor 224 and a controller 228, to control the extension and contraction of solar module 116. In such embodiments, guiding module 132 may also include a guide bar 244 to guide solar module 116 during the extension or contraction of solar module 116. In other embodiments, when the solar module 116 includes vertical blinds, stepper motor 224 and controller 228 may control an angle at which the vertical blinds are exposed to the radiant light, as illustrated by arrow 108.

Figure 3:
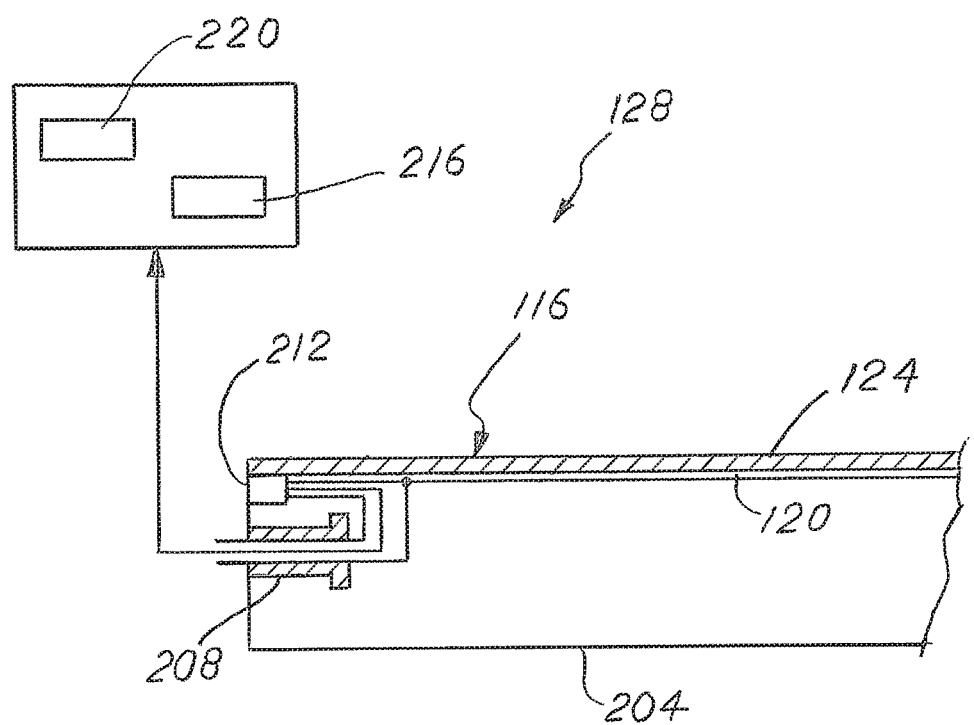
FIG. 3 illustrates a sectional view of the a guiding module of the window assembly as shown in FIG. 1 with the roller taken along line 2-2 of FIG. 2 used in accordance with embodiments of the invention.

FIG. 3 illustrates a sectional view 300 of the roller device 204 taken along line 2-2 of FIG. 2 of window assembly. As discussed above, solar module 116 is attached to roller device 204, PV film 124 is adhered to flexible substrate 120, and connector 212 electrically communicates with the network of PV cells and conductors. In the embodiment shown, as roller device 204 rotates to control the extension and contraction of solar module 116, a roller conductor 304 maintains its position rotation-free with respect to connector 212 to collect the converted energy. Other systems of energy collection may also be used. Exemplary types of energy collection include, but are not limited to, brush and armature system, capacitive coupling, inductive coupling, flexible wire system, and the like.

Figure 4:
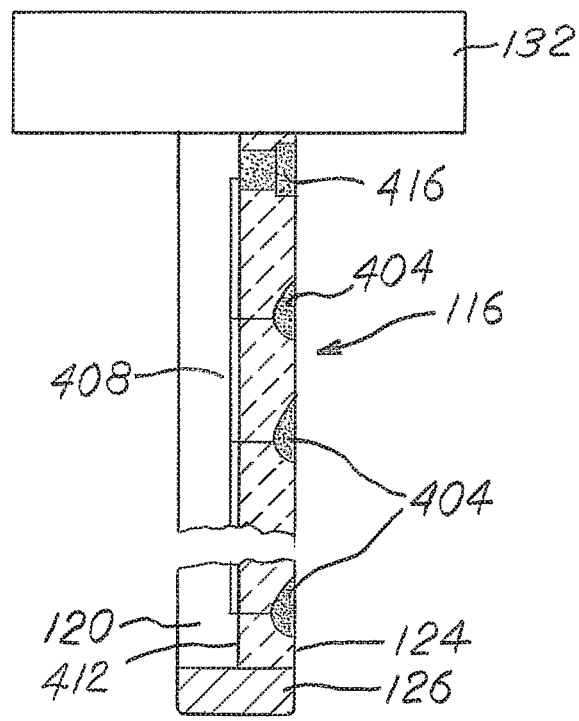
FIG. 4 illustrates a sectional view of the solar module as shown in FIG. 1 used in accordance with embodiments of the invention.

FIG. 4 illustrates a sectional view of solar module 116. PV film 124 includes a plurality of PV cells 404 linked together with a network of conductors 408. In the embodiment shown, conductors 408 extend from PV cells 404 to an interior surface 412 of PV film 124, and terminate at an embedded inverter 416. In some embodiments, embedded inverter 416 functions similar to inverter 220 of FIG. 2. As shown in FIG. 4, each of the plurality of PV cells 404 are shown to be separated from one another. It should be noted that this separation is generally for illustration purposes. Thus, the plurality of PV cells 404 may not be distanced from each other, in some embodiments.

Figure 4A:
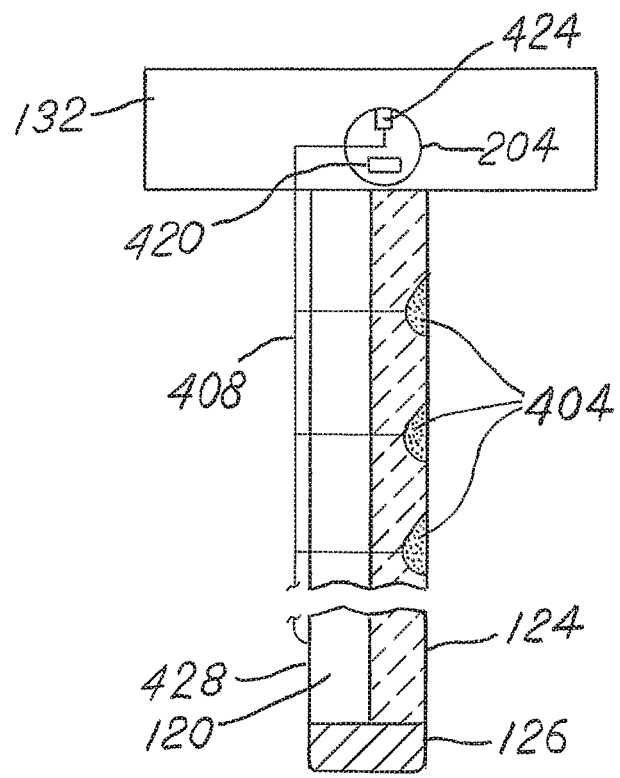
FIG. 4A illustrates a sectional view of a roller device having an embedded inverter used in accordance with embodiments of the invention.

In other embodiments, as shown in FIG. 4A, roller device 204 (shown as circle in FIG. 4A) may include an embedded inverter 420. In such embodiments, conductors 408 converge at a connector 424 (similar to connector 212 of FIG. 2) in the roller device 204. Connector 424 feeds the converted electrical energy to embedded inverter 420. In other embodiments, connector 424 feeds the converted electrical energy to inverter 220 in the roller device of FIG. 2.

In the embodiment shown in FIG. 4, the network of conductors 408 is sandwiched between substrate 120 and PV film 124. In other embodiments, as shown in FIG. 4A, the network of conductors 408 may extend through substrate 120, and converge at an exterior surface 428 of solar module 116. In still other embodiments, although not shown, the network of conductors 408 may extend from PV cells 404 and through PV film 124, and converge at connector 424.

In some embodiments, the PV film 124 of FIG. 1 contains a concentration of PV cells 404. The concentration of PV cells per area may be linearly dependent on the predefined openness of substrate 120 of FIG. 1. For example, in some embodiments, when substrate 120 has an openness of 5%, PV film 124 may have a concentration of 95%. Similarly, when substrate 120 has an openness of 10%, PV film 124 may have a concentration of about 90%. As a result, the openness of substrate 120 of FIG. 1 generally linearly defines an amount of power or electrical energy generated by PV film 124 of FIG. 1. For example, when PV film 124 or PV cells 404 have an efficiency of 20% with substrate 124 having an openness of 5%, then flexible PV film 124 may be reduced to about 19% (5% of 20%). Similarly, when PV film 124 or PV cells 404 have an efficiency of 20% with a substrate 124 having an openness of 10%, then flexible PV film 124 may be reduced to about 18% (10% of 20%).

In some embodiments, with a 95% concentration, the number of PV cells depends on the size of the substrate 120, and the size of PV cells 404 may have width ranging from 0.1 mm to 2 mm depending on characteristics, such as flexibility or bending capability, desired for the substrate 120. For example, with a 95% concentration and 0.1 mm wide cells, the substrate 120 may include 9500 cells per cm$^2$. For another example, with a 95% concentration and 2 mm wide cells, the substrate 120 may include 23.75 cells per cm$^2$. Further, if bending of the substrate 120 occurs in only one direction or axis, PV cells 404 may be long and slender. Exemplary PV cells may include Sliver Cells developed at the Australian National University. In such embodiments, there are 95 cells at 0.1 mm width and 4.75 cells at 2 mm widths per cm$^2$. In addition to widths, PV cells 404 may also be defined with thickness and length. Depending on applications, the thickness of PV cells 404 may range from 10 microns (μm) to 300 microns (μm), whereas the length of PV cells 404 may range from 0.1 mm up to 2 mm with shapes such as square, hexagonal, circular, or the like. In some embodiments, PV cells 404 may also be long and narrow, in which case, PV cells 404 may have a length of 6 inches, which may be the length of a standard crystalline silicon solar cell wafer. In some embodiments, hexagonal PV cells and circular PV cells may reduce or minimize the perimeter of the shape which has some advantages in reducing edge recombination which may tend to increase PV cell efficiency.

In some embodiments, PV cells 404 may be coated and/or oriented differently depending on applications. For example, when the substrate 120 is vertically oriented, PV cells 404 may be coated with anti-reflection coatings. In such embodiments, PV cells 404 coated with anti-reflection coatings may be modified to enhance or optimize for radiant light collection ability of PV cells 404. For example, a slightly thinner anti-reflection coating may be applied in PV cells 404 that are oriented in such a way that more light may be collected by PV cells 404 at normal incidence.

In some embodiments, each of PV cells 404 may include a light collector to focus incident light sensed therein. Since known range of angles of incident light for a vertically oriented substrate 120 is smaller than that for a horizontally oriented panel, concentrating optics may be used efficiently to collect incident light. In some cases, the light collector may have the same material as other packaging elements (i.e., films) in the solar module 116, for example, if curved lensing surface interfaces with the air. In some other cases, the light collector may have a different material than other packaging materials or films in the solar module 116, for example, if the lensing surface interfaces with packaging materials or films in the solar module 116 where materials may require a difference in their optical index values to create a focusing effect from any optical element.

In some embodiments, PV film 124 may have an output voltage ranging from 0.5V to 200V. The current output of each solar module 116 may be linearly dependent on the area of substrate 120 and the amount of light being exposed to substrate 120. The power or electrical energy output for a given solar module 116 may generally stay consistent for a given amount of light. For a window having solar module 116 with a predefined openness of 10% and 20% efficient cells, facing South, an area of 45 inches×80 inches, a glass transmission of 90%, in October in Chicago (a zenith receiving about of 400 W/m$^2$ of the radiant light), operating at 48V, solar module 116 may be able to generate 3 Amp of current.

Although PV cells 404 are shown to have a single connection to network of conductors 408, each of PV cells 404 may have points of contacts with the network of fingers or conductors 408. After the converted electrical energy has been extracted from PV cells 404, the converted electrical energy is fed to network of conductors 408 through, for example, flexible film, flexible circuit, flexible ribbons, and the like.

FIG. 4B illustrates a front view 432 of the window assembly 100 of FIG. 1. In the embodiment shown, the window assembly 100 includes a window frame 436 holding window pane 104 (of FIG. 1). Window assembly 100 also includes a set of side moldings 440 covering a gap between the window frame 436 and an edge of portion of solar module 116. In this way, side moldings 440 may trap transmitted radiant light 112 that is not absorbed by solar module 116. FIG. 4C illustrates a top view 444 of window frame 436 with respect to side moldings 440 of FIG. 4B. In such an embodiment, window pane 104 is spaced apart from side moldings 440 and solar module 116. Specifically, FIG. 4D illustrates an expanded view of window frame 436 with respect to side moldings 440 of FIG. 4C. In the embodiment shown in FIG. 4D, window pane 104 is spaced apart from solar module 116 by distance 122. In the embodiment shown, distance 122 ranges from 0 inches to ¹⁄₁₆ inches, and a second distance 452 between side molding 440 and window pane 104 ranges from 0 inches to ⅜ inches. In the embodiment shown, side molding 440 has a width of about ¾ inches.

FIG. 4E illustrates an alternative embodiment 456 in the form of a dual side molding 458 of solar module 116. In the embodiment as shown in FIG. 4E, dual side molding 458 covers two adjacent window frames 460. As shown FIG. 4F, which is a top sectional view of FIG. 4E along the line 4E1-4E1, dual side molding 458 includes a T-shape molding 462 extending interiorly from window frame 460. Window frame 460 includes a plurality of adjacent window panes 104. In the embodiment shown, the T-shape molding 462 provides side molding effects for a plurality of adjacent solar modules 116 covering respective window panes 104.

Figure 5:
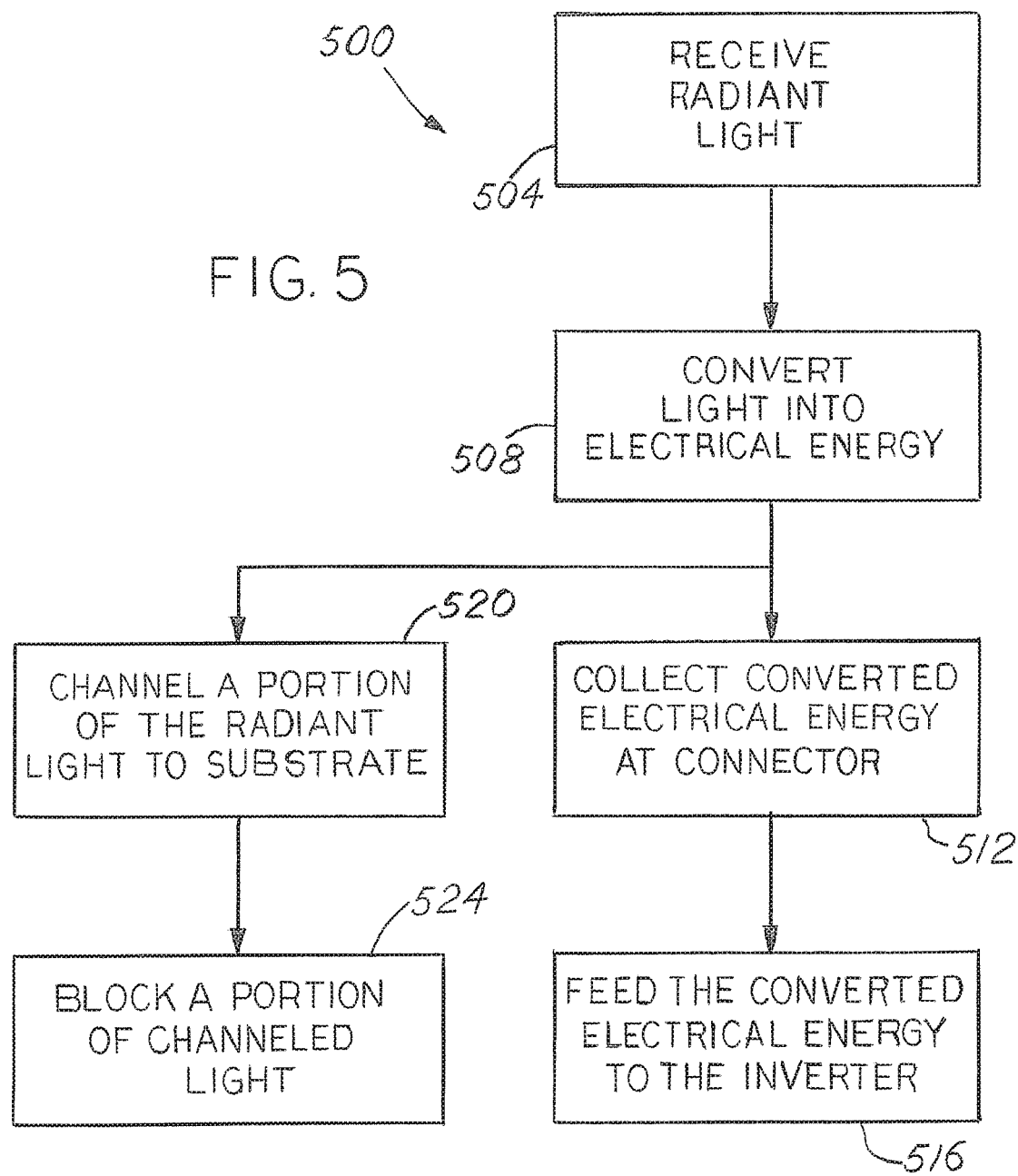
FIG. 5 is an operation flow chart of the operation of the window assembly as shown in FIG. 1 used in accordance with embodiments of the invention.

FIG. 5 is an operation flow chart 500 of window assembly 100 as shown in FIG. 1 used in accordance with embodiments of the invention. At step 504, solar module 116 of FIG. 1 receives the transmitted or refracted radiant light as illustrated by arrow 112. At step 508, PV cells 404 of FIG. 4 and FIG. 4A may convert the received light into electrical energy. As discussed above, when PV cells 404 of FIG. 4 and FIG. 4A are exposed to either to the radiant light or the transmitted or refracted radiant light as discussed above, PV cells 404 absorb the radiant light to generate electrons that are converted into electrical energy. Alternatively, if PV film 124 has an embedded inverter, the converted electrical energy may convert at inverter 416 of FIG. 4.

At step 512, connector 212, 424 receives the converted electrical energy. At step 516, connector 212, 424 feeds the converted electrical energy to inverter 220 of FIG. 2, 420 of FIG. 4A.

At step 520, PV film 124 of FIG. 1 may channel at least a portion of the radiant light or the transmitted or refracted radiant light to the substrate 120 of FIG. 1. At step 524, the substrate 120 of FIG. 1 may block another portion of the radiant light channeled through PV film 124, based on an openness of substrate 120 of FIG. 1.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

The invention claimed is:

1. A window assembly comprising:
a window pane having a surface, and positioned to be exposed to radiant light;
a solar module including a flexible photovoltaic layer overlying and adhered to a flexible insulating substrate, the solar module being movable relative to the window pane to position the flexible photovoltaic layer adjacent the surface of the window pane to receive at least a portion of the radiant light, the photovoltaic layer having a plurality of photovoltaic cells configured to convert the at least a portion of the radiant light into electrical energy, the plurality of photovoltaic cells sharing the flexible insulating substrate, and the flexible insulating substrate having a predefined openness of between 1% and 15% that corresponds to an amount of the radiant light that can pass through the flexible insulating substrate;
an energy module in electrical communication with the photovoltaic cells, the energy module configured to receive and distribute the electrical energy collected by the photovoltaic cells;
a guiding module configured to controllably extend and retract the solar module relative to the window pane to control an amount of the solar module and thus the flexible insulating substrate and thus a number of the photovoltaic cells exposed to the radiant light and thus an amount of electrical energy being generated by the photovoltaic cells, wherein when the guiding module has fully extended the solar module, the plurality of photovoltaic cells are exposed to the radiant light, and wherein when the guiding module has fully retracted the solar module, the plurality of photovoltaic cells are not exposed to the radiant light; and
a window frame that supports the window pane and a molding covering a gap between the window frame and an edge of the solar module, wherein the edge of the solar module is positioned between the window pane and the molding to trap radiant light that is not absorbed by the solar module.

2. The window assembly of claim 1, wherein the photovoltaic layer is further configured to be positioned at a non-zero distance from the window pane.

3. The window assembly of claim 1, wherein each of the photovoltaic cells is configured to convert the at least a portion of the radiant light into electrical energy.

4. The window assembly of claim 3, wherein the predefined openness has a linear relationship with the number of photovoltaic cells.

5. The window assembly of claim 3, further comprising a flexible electrical conductor network interconnecting the photovoltaic cells with the energy module.

6. The window assembly of claim 1, wherein the photovoltaic layer and the insulating substrate form a laminate.

7. The window assembly of claim 1, wherein the electrical energy is a direct-current (DC) electrical energy, and wherein the energy module is further configured to invert the DC electrical energy into alternate-current (AC) electrical energy.

8. An energy collection device for use with a window having a window pane supported within a window frame, the window pane having an interior surface and exterior surface positioned to be exposed to radiant light, comprising:
a solar module including a flexible photovoltaic layer overlying and adhered to a flexible insulating substrate, the flexible photovoltaic layer being positionable adjacent the interior surface of the window pane to be exposed to radiant light transmitted through the window pane, the photovoltaic layer having a plurality of photovoltaic cells to convert the radiant light into electrical energy, the plurality of photovoltaic cells sharing the flexible insulating substrate, the flexible insulating substrate having a predefined openness of between 1% and 15% that corresponds to an amount of the radiant light that can pass through the flexible insulating substrate and being configured to block out a portion of the radiant light based on the openness;
an energy module in electrical communication with the photovoltaic layer configured to receive and distribute the electrical energy collected via the plurality of photovoltaic cells;
a guiding module configured to controllably extend and retract the solar module relative to the interior surface of the window pane to control an amount of the solar module and thus the flexible insulating substrate and thus a number of the photovoltaic cells exposed to the radiant light and thus an amount of electrical energy being generated by the photovoltaic cells; and
a molding covering a gap between the window frame and an edge of the solar module; and
wherein the edge of the solar module is positioned between the window pane and the molding to trap radiant light that is not absorbed by the solar module.

9. The energy collection device of claim 8, wherein each of the photovoltaic cells is configured to convert the first portion of the radiant light into electrical energy.

10. The energy collection device of claim 8, wherein the photovoltaic layer is adhered to the insulating substrate.

11. The energy collection device of claim 8, wherein the photovoltaic layer and the insulating substrate form a laminate.

12. The energy collection device of claim 9, wherein each of the photovoltaic cells comprises a flexible electrical conductor configured to electrically communicate the converted electrical energy to the energy module.

13. The energy collection device of claim 12, wherein the predefined openness has a linear relationship with the number of photovoltaic cells.

14. The energy collection device of claim 8, wherein the electrical energy is a direct-current (DC) electrical energy; and wherein the energy collection module further comprises an inverter configured to invert the DC electrical energy into alternate-current (AC) electrical energy.

15. The window assembly of claim 1, wherein the solar module further comprises an embedded inverter for converting direct-current (DC) electrical energy collected by the photovoltaic cells into alternate-current (AC) electrical energy.

16. The window assembly of claim 5, wherein the flexible electrical conductor network is sandwiched between the flexible photovoltaic layer and the flexible insulating substrate.

17. The window assembly of claim 1, wherein the guiding module includes a motorized roller device configured to controllably extend and retract the solar module relative to the interior surface of the window pane to control an amount of the solar module and a rotatable connector electrically interconnecting the photovoltaic cells with the energy module.

18. An energy collection device for use with a window having a window pane supported within a window frame, the window pane having an interior surface and exterior surface positioned to be exposed to radiant light, the window pane having a vertical extent, the energy collection module comprising:
 a solar module including a flexible photovoltaic layer overlying and adhered to a flexible insulating substrate, the flexible photovoltaic layer being positionable adjacent the interior surface of the window pane to be exposed to radiant light transmitted through the window pane, the photovoltaic layer having a plurality of photovoltaic cells to convert the radiant light into electrical energy, the flexible insulating substrate having a predefined openness of between 1% and 15% that corresponds to an amount of the radiant light that can pass through the flexible insulating substrate, the flexible photovoltaic layer and the flexible insulating substrate sized to be coextensive with at least the vertical extent of the window pane, the solar module further including a flexible electrical conductor network sandwiched between the flexible photovoltaic layer and electrically interconnecting the photovoltaic cells to transmit the electrical energy generated by the photovoltaic cells;
 an energy module configured to receive and distribute electrical energy from the solar module;
 a guiding module including a motorized roller device configured to controllably extend and retract the solar module relative to the interior surface of the window pane to control an amount of the solar module and thus a number of the photovoltaic cells exposed to the radiant light and thus an amount of electrical energy being generated by the photovoltaic cells, the guiding module including a rotatable connector electrically interconnecting the flexible electrical connector network with the energy module; and
 a molding covering a gap between the window frame and an edge of the solar module wherein the edge of the solar module is positioned between the window pane and the molding to trap radiant light that is not absorbed by the solar module.

19. The window assembly of claim 1, wherein the flexible insulating substrate is formed from a mesh scrim comprising a plurality of holes, each of the photovoltaic cells is configured to convert the at least a portion of the radiant light into electrical energy.

20. The window assembly of claim 1, wherein the photovoltaic cells are coated with anti-reflective coatings.

21. The window assembly of claim 8, wherein the photovoltaic cells are coated with anti-reflective coatings.

\* \* \* \* \*